(12) United States Patent
Lassalle-Balier et al.

(10) Patent No.: US 10,837,753 B2
(45) Date of Patent: Nov. 17, 2020

(54) MAGNETIC FIELD SENSOR USING MR ELEMENTS FOR DETECTING FLUX LINE DIVERGENCE

(71) Applicant: Allegro MicroSystems, LLC, Manchester, NH (US)

(72) Inventors: Rémy Lassalle-Balier, Bures sur Yvette (FR); Jeffrey Eagen, Manchester, NH (US); Andrea Foletto, Annecy le Vieux (FR); Paul A. David, Bow, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 80 days.

(21) Appl. No.: 16/244,452

(22) Filed: Jan. 10, 2019

(65) Prior Publication Data

US 2020/0225020 A1    Jul. 16, 2020

(51) Int. Cl.
*G01B 7/14* (2006.01)
*G01R 33/09* (2006.01)
*G01D 5/14* (2006.01)

(52) U.S. Cl.
CPC ............... *G01B 7/14* (2013.01); *G01D 5/145* (2013.01); *G01R 33/09* (2013.01); *G01R 33/091* (2013.01); *G01D 5/142* (2013.01)

(58) Field of Classification Search
CPC ... G01B 7/00; G01B 7/14; G01B 7/30; G01R 33/00; G01R 33/02; G01R 33/06; G01R 33/09; G01R 33/091; G11B 5/33; G11B 5/39; G11B 2005/0016; G11B 2005/3996; G05B 2219/37; G05B 2219/37124; G05B 2219/37185; G01D 5/00; G01D 5/12; G01D 5/14; G01D 5/142; G01D 5/145; G01D 5/2033; G01D 5/2241; G05G 2009/04755; Y10T 428/1107
USPC ......... 324/200, 207.11, 207.13, 207.21, 600, 324/629, 633, 635, 644, 662, 699, 716, 324/207.2, 244, 252
See application file for complete search history.

(56) References Cited

U.S. PATENT DOCUMENTS

| | | | |
|---|---|---|---|
| 6,070,333 A * | 6/2000 | Kutzner | G01C 17/26 324/244 |
| 9,347,799 B2 * | 5/2016 | Nazarian | G01D 5/145 |
| 9,719,806 B2 | 8/2017 | Foletto et al. | |
| 2004/0075430 A1 * | 4/2004 | Haji-Sheikh | G01R 33/09 324/252 |
| 2005/0194966 A1 * | 9/2005 | Martinez | G01D 5/145 324/207.2 |
| 2014/0103918 A1 * | 4/2014 | Nomura | G01R 15/205 324/244 |
| 2015/0309128 A1 * | 10/2015 | Raberg | G01R 33/0041 324/252 |

(Continued)

OTHER PUBLICATIONS

U.S. Appl. No. 15/883,721, filed Jan. 30, 2018, Foletto et al.

*Primary Examiner* — Hoai-An D. Nguyen
(74) *Attorney, Agent, or Firm* — Daly Crowley Mofford & Durkee, LLP

(57) ABSTRACT

Methods and apparatus for s sensor having magnetic field sensing elements coupled in a differential bridge and a signal processor configured to receive signals from the bridge to determine a distance from the magnetic field sensing elements to a magnet from flux line divergence of magnetic flux generated by the magnet.

35 Claims, 7 Drawing Sheets

(56) References Cited

U.S. PATENT DOCUMENTS

| | | | |
|---|---|---|---|
| 2015/0331072 A1* | 11/2015 | Ogawa | G01R 33/1253 |
| | | | 324/252 |
| 2015/0377648 A1* | 12/2015 | Sirohiwala | G01D 5/165 |
| | | | 324/207.2 |
| 2016/0202086 A1* | 7/2016 | Raberg | G01R 33/093 |
| | | | 324/207.21 |
| 2016/0266216 A1* | 9/2016 | Tanabe | G01R 33/093 |
| 2017/0212176 A1* | 7/2017 | Holm | G01R 17/10 |
| 2017/0317561 A1* | 11/2017 | Stolfus | G01D 5/145 |
| 2017/0356760 A1 | 12/2017 | David et al. | |
| 2017/0356762 A1 | 12/2017 | David et al. | |
| 2018/0335483 A1* | 11/2018 | Takaki | G01R 15/205 |
| 2019/0025346 A1* | 1/2019 | Latham | G01R 15/20 |
| 2019/0339101 A1* | 11/2019 | Meyer | G01R 33/0017 |

\* cited by examiner

MAGNETIC FIELD SENSOR USING MR ELEMENTS FOR DETECTING FLUX LINE DIVERGENCE

BACKGROUND

Magnetic sensors are widely used in modern systems to measure or detect physical parameters, such as magnetic field strength, current, position, motion, orientation, and so forth. There are many different types of sensors for measuring magnetic fields and other parameters. However, such sensors suffer from various limitations, for example, excessive size, inadequate sensitivity dynamic range, cost, and/or reliability and the like.

SUMMARY

The present invention provides method and apparatus for a magnetic field sensor having magnetic field sensing elements for measuring over distance, e.g., an airgap, the divergence of the flux lines generated by a magnet. In embodiments, the direction of the flux lines is determined with respect to a plane from which the flux lines extend from the magnet. Linear sensors can be provided by sensing the divergence of magnetic flux lines over an air gap from the plane of the magnet.

Example sensor embodiments have enhanced performance (e.g., sensitivity and immunity to stray field) over a larger air gap range, as compared to conventional sensors. Immunity to stray fields may be achieved using a different bridge of MR elements due to the symmetry of the flux lines generated by the magnet.

In one aspect, a sensor comprises: magnetic field sensing elements coupled in a differential bridge; and a processing module configured to receive signals from the bridge to determine a distance from the magnetic field sensing elements to a magnet from flux line divergence of magnetic flux generated by the magnet.

A sensor can further include one or more of the following features: the magnetic field sensing elements comprise MR elements, the magnetic field sensing elements comprise GMR elements, the magnetic field sensing elements comprise Hall elements, a die, wherein the magnetic field sensing elements are positioned in relation to the die, the magnetic field sensing elements are located in a plane, the bridge element comprise elements L1, L2, R1, R2, and an output signal comprises combining signals from L1, L2, R1, R2, an output signal corresponding to the determined distance from the magnetic field sensing elements to the magnet is substantially linear for a given airgap range, the magnetic field sensing elements comprise first, second, third, and fourth MR elements coupled in a bridge, wherein the first and second MR elements are located in proximity to each other, the third and fourth MR elements are located in proximity to each other, the magnetic field sensing elements comprise MR elements couple in a bridge having first and second pairs of MR elements, wherein the first and second pairs of the MR elements are spaced apart less than a width of the magnet, the processing module subtracts signals from the first pair of MR elements from signals from the second pair of MR elements, the processing module includes a transfer function for airgap versus output signal, wherein the transfer function includes a shape of the magnet, the shape of magnet includes a curved surface, the curved surface comprises a convex shape, the magnetic field sensing elements comprise MR elements coupled in a bridge, and/or each of the MR elements are substantially symmetric with respect to each other.

In another aspect, a method comprises: employing magnetic field sensing elements coupled in a differential bridge; and employing a processing module configured to receive signals from the bridge to determine a distance from the magnetic field sensing elements to a magnet from flux line divergence of magnetic flux generated by the magnet.

A method can further include one or more of the following features: the magnetic field sensing elements comprise MR elements, the magnetic field sensing elements comprise GMR elements, the magnetic field sensing elements comprise Hall elements, a die, wherein the magnetic field sensing elements are positioned in relation to the die, the magnetic field sensing elements are located in a plane, the bridge element comprise elements L1, L2, R1, R2, and an output signal comprises combining signals from L1, L2, R1, R2, an output signal corresponding to the determined distance from the magnetic field sensing elements to the magnet is substantially linear for a given airgap range, the magnetic field sensing elements comprise first, second, third, and fourth MR elements coupled in a bridge, wherein the first and second MR elements are located in proximity to each other, the third and fourth MR elements are located in proximity to each other, the magnetic field sensing elements comprise MR elements couple in a bridge having first and second pairs of MR elements, wherein the first and second pairs of the MR elements are spaced apart less than a width of the magnet, the processing module subtracts signals from the first pair of MR elements from signals from the second pair of MR elements, the processing module includes a transfer function for airgap versus output signal, wherein the transfer function includes a shape of the magnet, the shape of magnet includes a curved surface, the curved surface comprises a convex shape, the magnetic field sensing elements comprise MR elements coupled in a bridge, and/or each of the MR elements are substantially symmetric with respect to each other.

In a further aspect, a magnet sensor IC package comprises: means for magnetic field sensing having elements coupled in a differential bridge; and a means for processing for receiving signals from the bridge and determining a distance from the magnetic field sensing elements to a magnet from flux line divergence of magnetic flux generated by the magnet. An IC package can further include a die, wherein the magnetic field sensing elements are positioned in relation to the die. An IC package can further include the bridge elements having elements L1, L2, R1, R2, and an output signal combining signals from L1, L2, R1, R2. An IC package can further include that the means for processing module includes a transfer function for airgap versus output signal, wherein the transfer function includes a shape of the magnet.

BRIEF DESCRIPTION OF THE DRAWINGS

The foregoing features of this invention, as well as the invention itself, may be more fully understood from the following description of the drawings in which.

DETAILED DESCRIPTION

Figure 1:
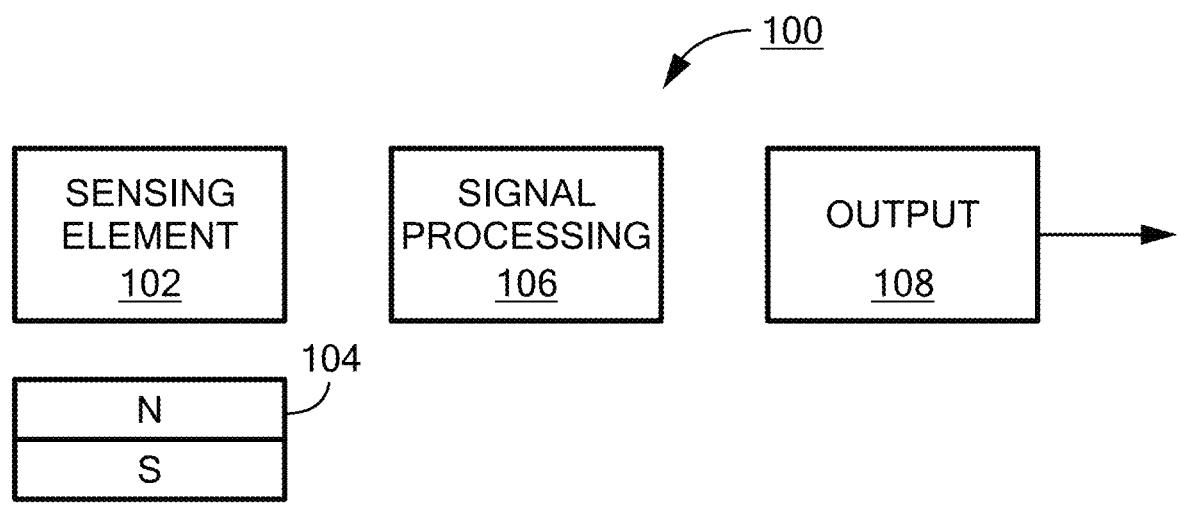
FIG. 1 is a block diagram of a sensor detecting magnetic flux line divergence for determining an airgap.

FIG. 1 shows an example sensor 100 having a magnetic field sensing element 102 positioned in relation to a magnet 104. A signal processing module 106 is coupled to the magnetic field sensing element 102 for processing an output signal of the magnetic field sensing element. In embodiments, the magnetic field sensing element 102 can include magnetoresistive (MR) elements coupled in a bridge configuration, for example. In other embodiments, Hall elements are used. An output module 108 can be coupled to the signal processing module 106 for generating an output signal, such as the output signal on an IO pin of an integrated circuit package. As described more fully below, for a given range in airgap between the magnet 104 and the sensing element 102, an output signal can be substantially linear.

Figure 1A:
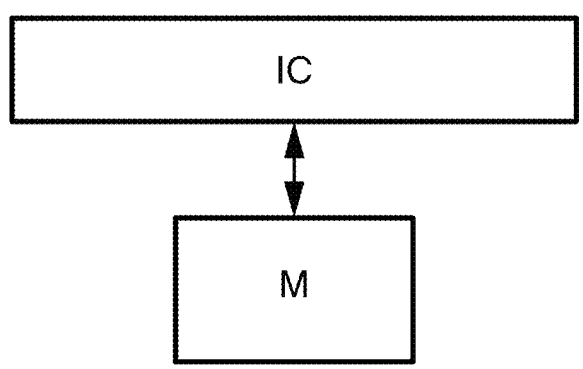
FIG. 1A shows an example representation of an sensor IC package having an airgap with a magnet.

FIG. 1A shows an example sensor IC package 150 having a variable air gap with respect to a magnet 152. As described more fully, below the sensor 150 can provide an output signal corresponding to the airgap between the IC package/sensors and the magnet.

Figure 2:
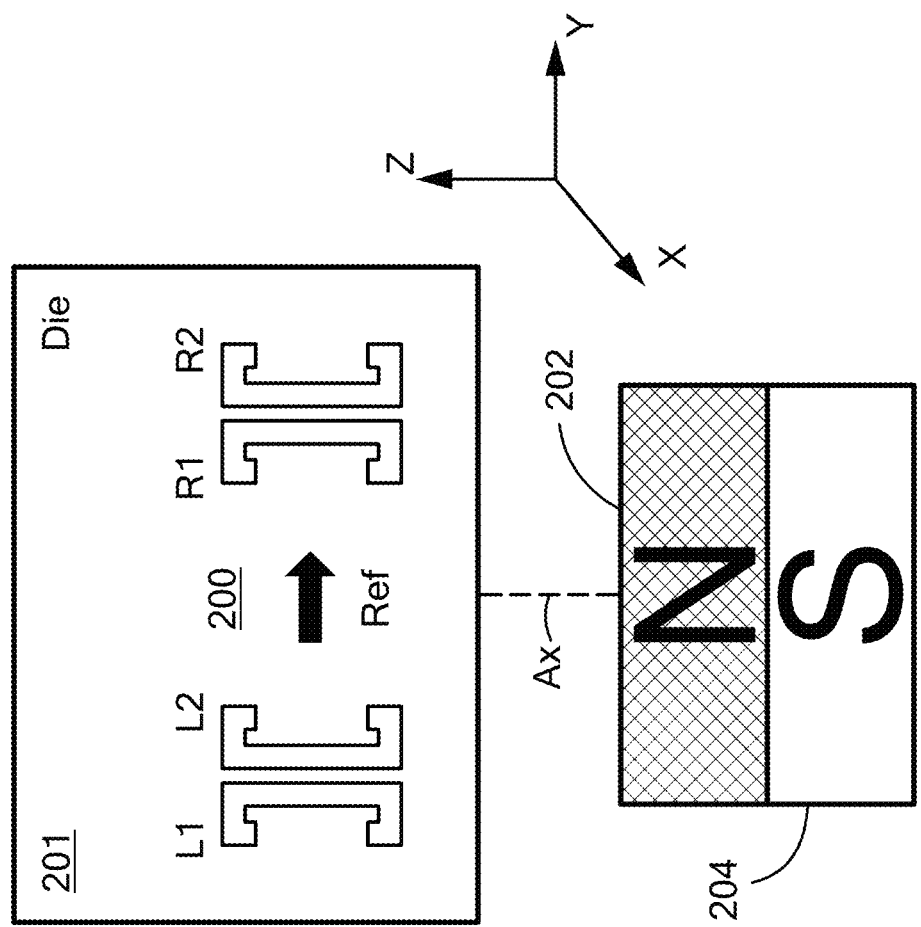
FIG. 2 is a schematic representation of sensor having a sensing element bridge.

FIG. 2 shows an example embodiment of a magnetic field sensing element 200 provided as magnetoresistive (MR) elements L1, L2, R1, R2 coupled in a bridge configuration positioned in relation to a die 201 and a planar surface 202 of a magnet 204. The bridge elements L1, L2, R1, R2 are in, on, or about the die 201. In embodiments, MR elements L1 and L2 are as close together as possible and MR elements R1 and R2 are as close together as possible. The length of each yoke may be limited to avoid averaging over distance which may impact accuracy). In embodiments, bridge spacing (distance between L1, L2 and R1, R2) should be selected as not too small (to avoid decreasing sensitivity) and not larger than the magnet width).

Figure 3:
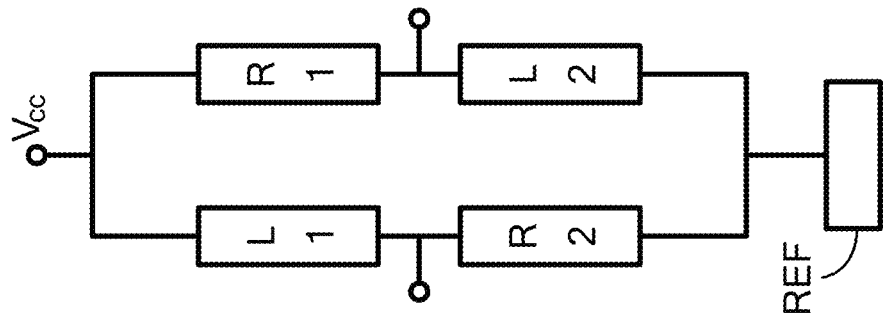
FIG. 3 is a circuit diagram showing the bridge element connection for the bridge of FIG. 2.
Figure 6:
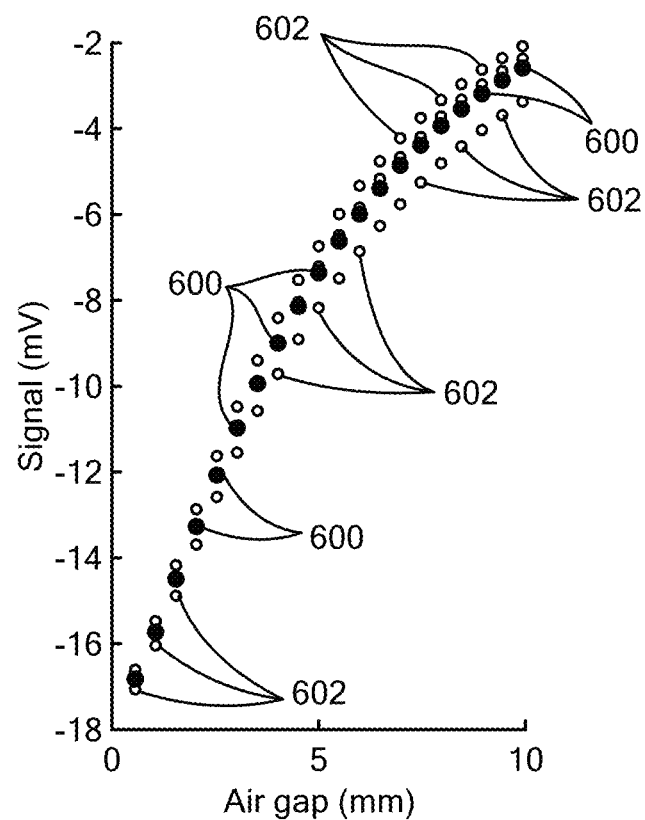
FIG. 6 is an example plot of a sensing element output signal versus airgap.

FIG. 3 shows an example circuit implementation of a bridge in which MR elements L1, L2, R1, R2 are coupled to a reference REF, such as ground. In the illustrated embodiment, L refers to left and R refers to right in the example physical bridge configuration and should not be considered limiting any way. In embodiments, a differential measurement of the bridge is used for which an example transfer function is shown in FIG. 6. This transfer function depends upon the magnet shape, and thus, should be calibrated for the magnet in the application.

It is understood that magnetoresistance refers to the dependence of the electrical resistance of a sample on the strength of external magnetic field characterized as:

$$\delta_H = [R(0) - R(H)]/R(0)$$

where R(H) is the resistance of the sample in a magnetic field H, and R(0) corresponds to H=0. The term "giant magnetoresistance" indicates that the value $\delta_H$ for multilayer structures significantly exceeds the anisotropic magnetoresistance, which has a typical value within a few percent.

Giant magnetoresistance (GMR) is a quantum mechanical magnetoresistance effect observed in thin-film structures composed of alternating ferromagnetic and non-magnetic conductive layers. The effect is observed as a significant change in the electrical resistance depending on whether the magnetization of adjacent ferromagnetic layers are in a parallel or an antiparallel alignment. The overall resistance is relatively low for parallel alignment and relatively high for antiparallel alignment. The magnetization direction can be controlled, for example, by applying an external magnetic field. The effect is based on the dependence of electron scattering on the spin orientation. A bridge of four identical GMR devices is insensitive to a uniform magnetic field and is reactive when the field directions are antiparallel in the neighboring arms of the bridge.

It is understood that the bridge elements can be configured in any practical arrangement to meet the needs of a particular application without departing from the scope of the claimed invention.

Referring again to FIG. 2, in the illustrated embodiment, the left bridge elements L1, L2 are positioned together and the right bridge elements R1, R2 are positioned together. In embodiments, the bridge elements L1, L2, R1, R2, are formed in or about a semiconductor die 201. Reference arrow REF shows the axis of sensitivity for the sensor along the X axis in the plane of the die 201. Bridge elements R1, R2 see signals parallel to the reference plane (X axis in the illustrated embodiment) and bridge elements L1, L2, see signals anti-parallel to the reference plane. In an example embodiment, the right element R1, R2 signals are subtracted from the left element L1, L2 signals, as described more fully below. Stray fields are rejected since the left and right elements see opposing signals.

In example embodiments, the left pair of bridge elements L1, L2 is positioned an equal distance from the right pair of bridge elements R1, R2 with respect to an axis AX extending perpendicularly from a center of the planar surface 202 of the magnet 204. It will be appreciated that for perfectly symmetrical placement of the bridge elements L1, L2, R1, R2 with respect to each other and the magnet planar surface, the flux lines seen by the left and right bridge elements will be the same magnitude in an ideal system. In embodiments, for a given airgap range the sensor output will be substantially linear, as described more fully below.

Figure 5:
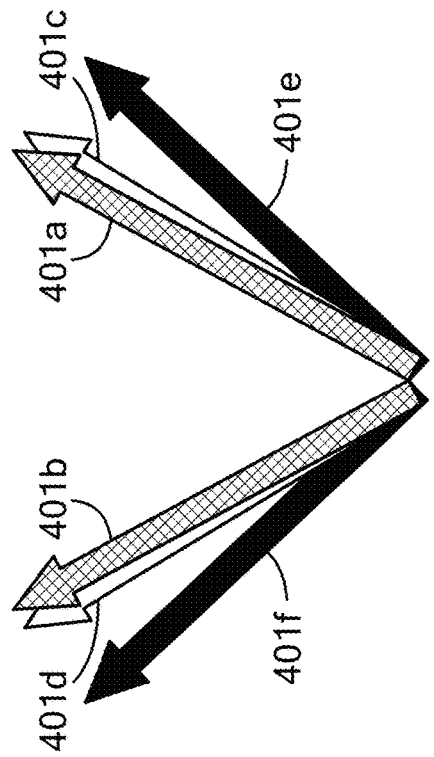
FIG. 5 shows an example representation of tangent lines for flux lines shown in FIG. 4.
Figure 4:
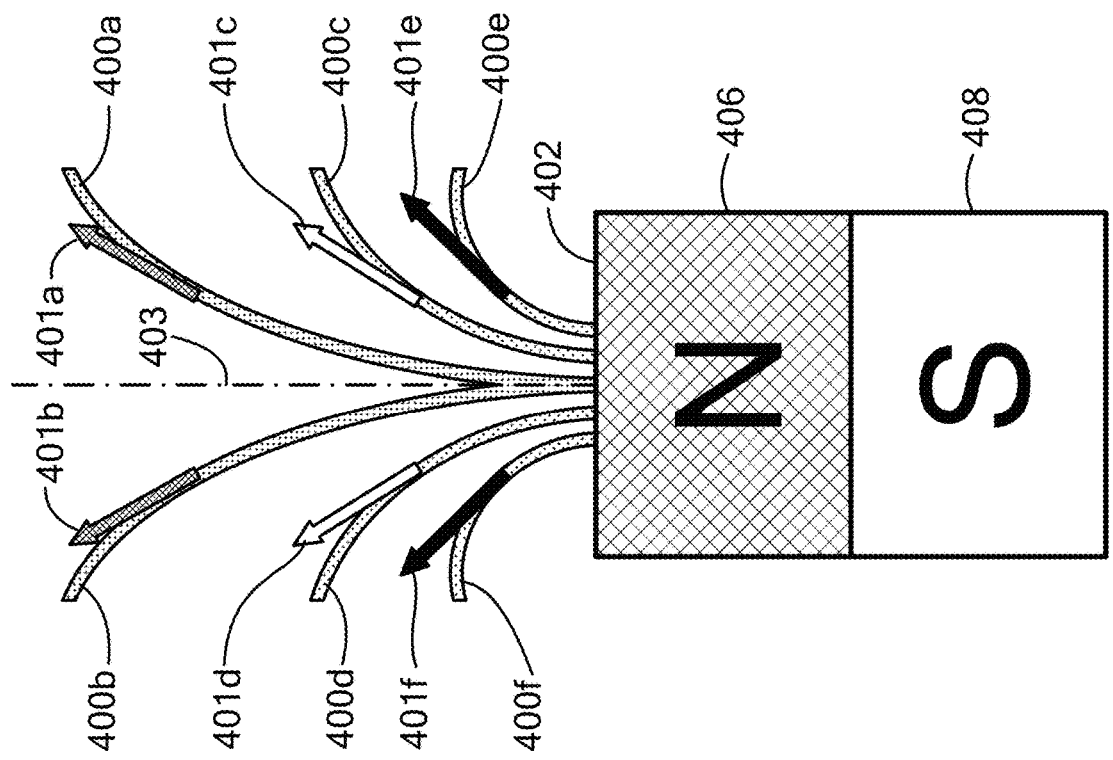
FIG. 4 is a schematic representation of flux line divergence for an example magnet.

FIG. 4 shows flux lines 400a-f generated from a planar surface 402 of a magnet 404 shown having a north pole 406 and a south pole 408. In the illustrated embodiment, the flux lines 400 are shown exiting the north pole 406 of the magnet. The flux lines 400 are shown in symmetric pairs, e.g., first pair 400a, b, second pair 400c, d, and third pair 400e, f. Each of the flux lines 400 is shown having a respective tangent arrow 401a-f corresponding to a given distance from the plane of the magnet. As can be seen, in the illustrated embodiment, the tangent arrows 401 for each pair of flux lines 400 is symmetric about an axis 403 perpendicular to the planar surface 402 of the magnet. For example, tangent arrows 401a, 401b for the first pair of flux lines are symmetrical about the axis 403 extending perpendicularly from the planar surface 402 of the magnet, as shown more clearly in FIG. 5. In embodiments, the axis 403 is located in a center of the magnet planar surface 402 corresponding to symmetric flux line pairs.

As can be seen, the orientation of the magnetic flux lines 400 and tangent arrows 401 changes with a distance from the planar surface 402 of the magnet. Since the flux lines 400 are symmetric about the axis 402, the magnetic field sensing elements (e.g., L1, L2, R1, R2 of FIG. 2) can be assembled in a differential bridge, for example, to measure the angles of the flux lines.

In an example embodiment, a GMR element comprises a double pinned stack with a 1000e bias parallel to the magnetization of the magnet and a bridge biased with 2.8V. It is understood that a variety of GMR element configuration and characteristics can be used to meet the needs of a particular application without departing from the scope of the claimed invention.

FIG. 6 shows example data for a GMR sensor over a 3.8×3.8×2.75 mm NdFeB magnet where a signal level in mV is shown versus air gap in mm, where the air gap is the distance between the package and the magnet. A first set of dots 600 represents an output signal when no common mode field is applied. As can be seen, a generally linear response is defined by the first set of dots. A second set of dots 602 represents an output signal when a 200e field is applied in X, −X, Y and −Y directions with respect to a plane of the die (see FIG. 2), where X is the reference direction. The plots show the dependence of the signal over placement of the sensor.

Figure 7A:
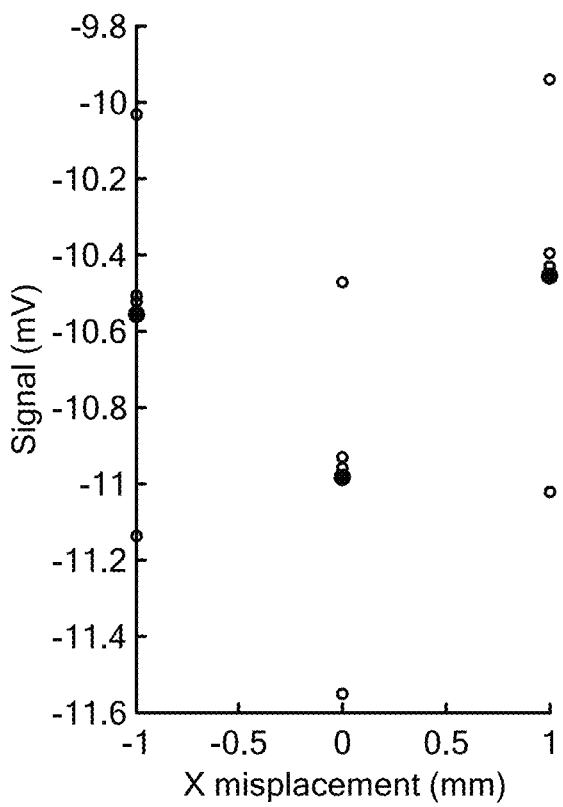
FIGS. 7A and 7B show example plots of MR-based sensing element output signal data with and without a common mode field for sensor displacement.
Figure 7B:
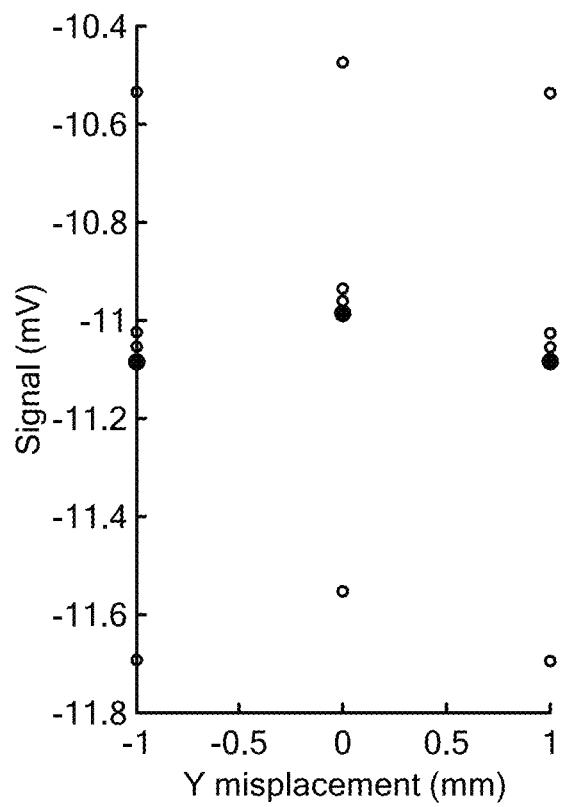

FIG. 7A shows example sensor data for X axis displacement where a first set of dots 700 correspond to no applied common mode field and a second set of dots 702 correspond to an applied field of 20 Oe in X, −X, Y, and −Y directions and FIG. 7B shows Y axis displacement data. FIGS. 7A and 7B show dependence of the signal over placement of the sensor. Misplacement refers to when the sensor is not placed in the center of the magnet. For example, a pure X misplacement is when the axis 403 is still in the plane of the die but not centered on the bridge. A pure Y misplacement is when the axis 403 is not in the plane of die any more but is in the median plane of the bridge.

As can be seen, sensitivity of a GMR-based sensor is lower at small air gaps and higher at intermediate air gaps. In addition, immunity to stray fields is better for GMR as compared to Hall effect sensing elements for air gap higher than 4 mm, for example, in illustrative embodiments.

In embodiments, the magnet can be shaped to engineer the divergence of the flux lines to meet the needs of a particular application. For example, the magnet may have a convex shape so that an increase in flux divergence at smaller distances may be achieved. Concave magnet shapes can be also be used. In embodiments, the curve of the magnet can be selected to achieve desired flux line divergence characteristics. Example curves can be defined by various functions, such as hyperbolic, eccentric, circular, parabolic, exponential, polygonal, and the like.

Figure 8:
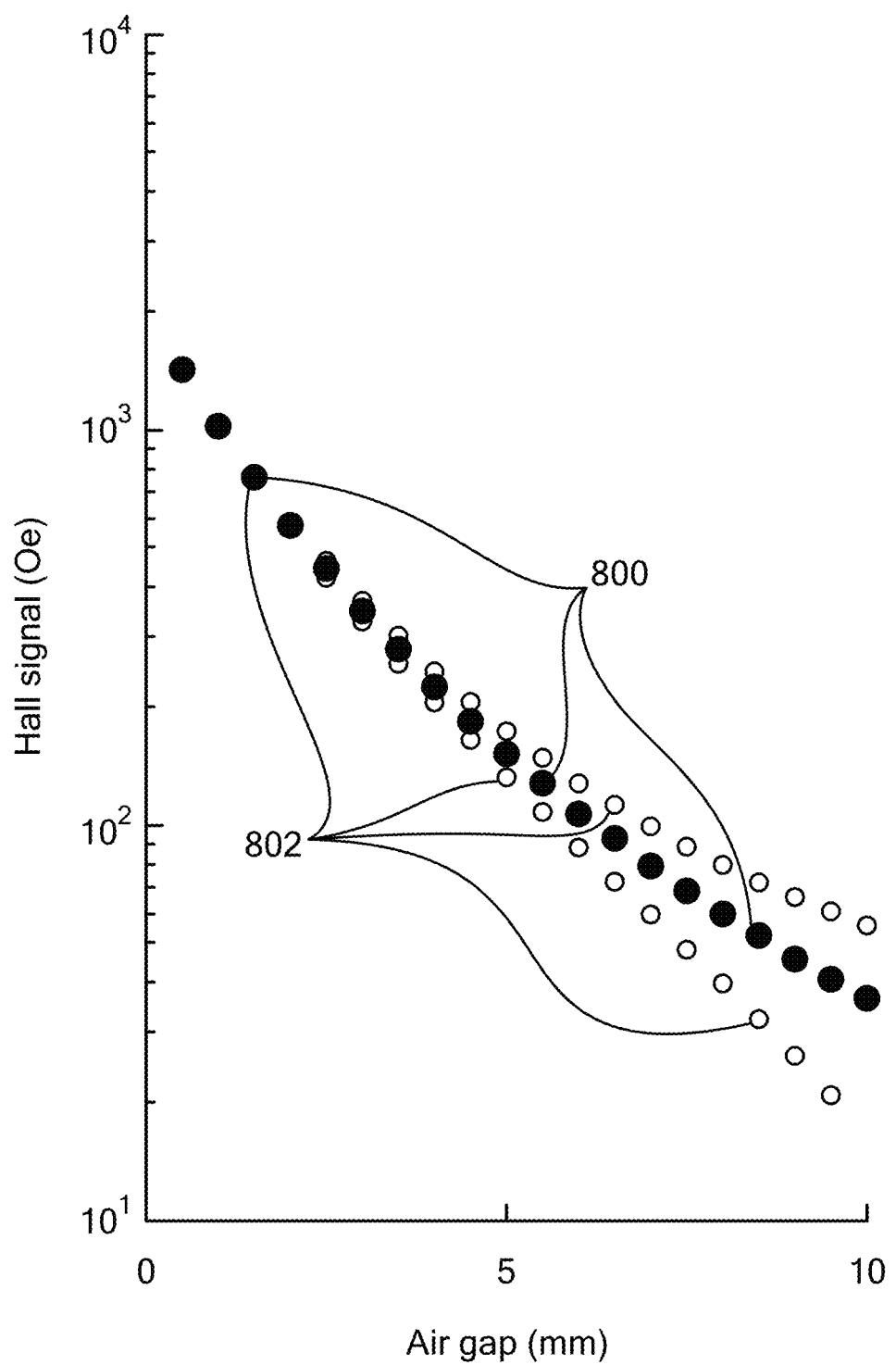
FIG. 8 is an example plot of sensing element output signal data for a Hall element based sensor embodiment.

FIG. 8 shows example magnetic sensing element output signal data represented as a first set of dots 800 for a Hall element versus air gap in mm. As can be seen the Hall output data 800 is generally decreasing exponentially. A second set of dots represents the output signal in the presence of a common mode (stray) field of about 20 Oe applied in the Z and −Z direction (out of the plane of the die). In the illustrated embodiment, the Y-axis is log scale.

Figure 9:
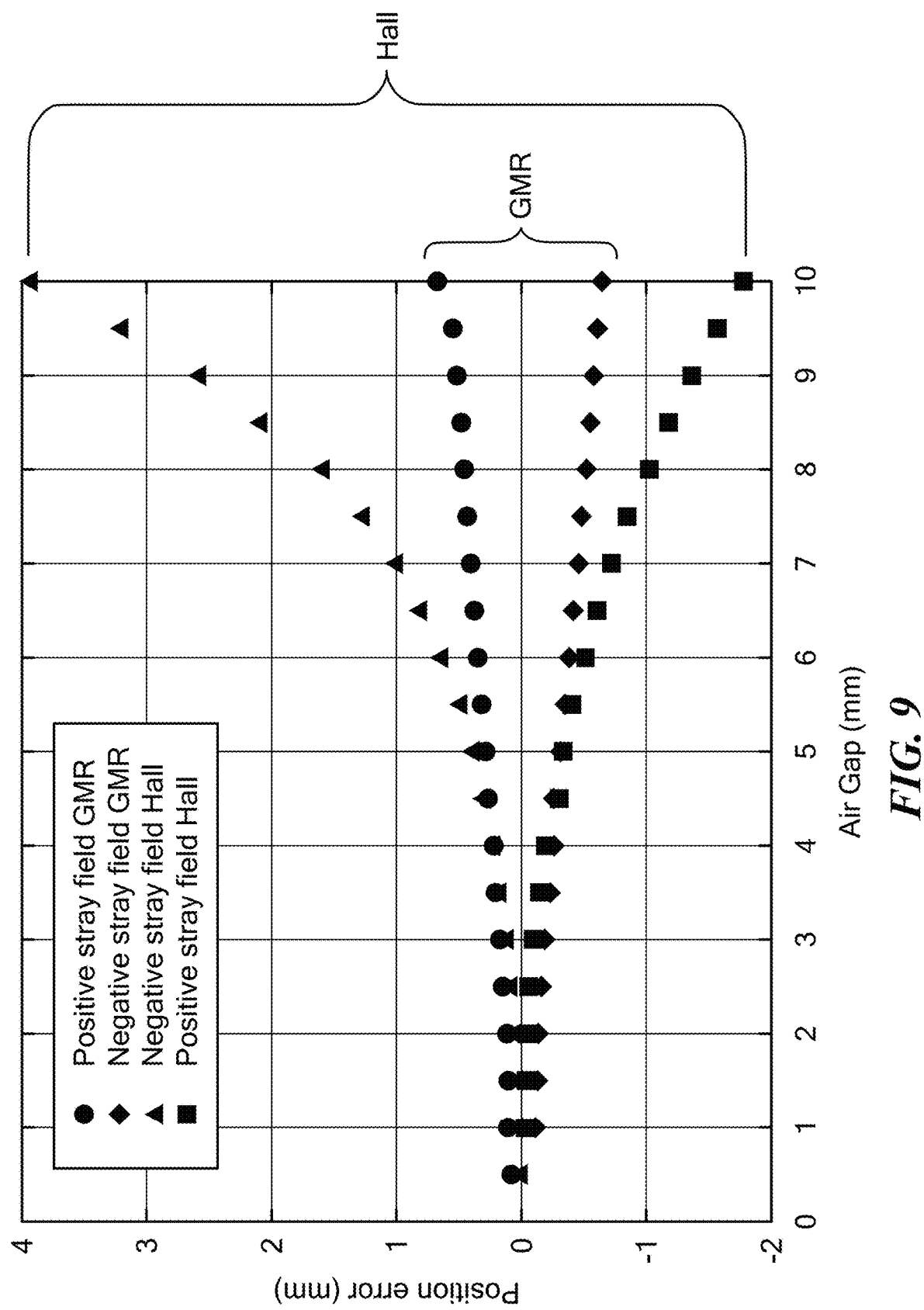
FIG. 9 is an example plot showing example maximum position error for MR and Hall-based sensor embodiments.

FIG. 9 shows an example maximum error position of an illustrative GMR-based sensor and a Hall-based sensor with applied common mode field of about 20 Oe. As can be seen, the GMR-based sensor embodiments retain accuracy over a larger air gap range than the Hall-based sensor embodiments.

Embodiments of the invention are useful for a wide range of sensing applications including wheel speed, engine sensors, transmission sensors and speed sensing in general here a ring magnet is used.

As used herein, the term "magnetic field sensing element" is used to describe a variety of electronic elements that can sense a magnetic field. The magnetic field sensing element can comprise, but is not limited to, a Hall Effect element, a magnetoresistance element, and/or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, a magnetic tunnel junction (MTJ), and a spin-valve. The magnetic field sensing element may be a single element or, alternatively, may include two or more magnetic field sensing elements arranged in various configurations, e.g., a half bridge or full bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 10:
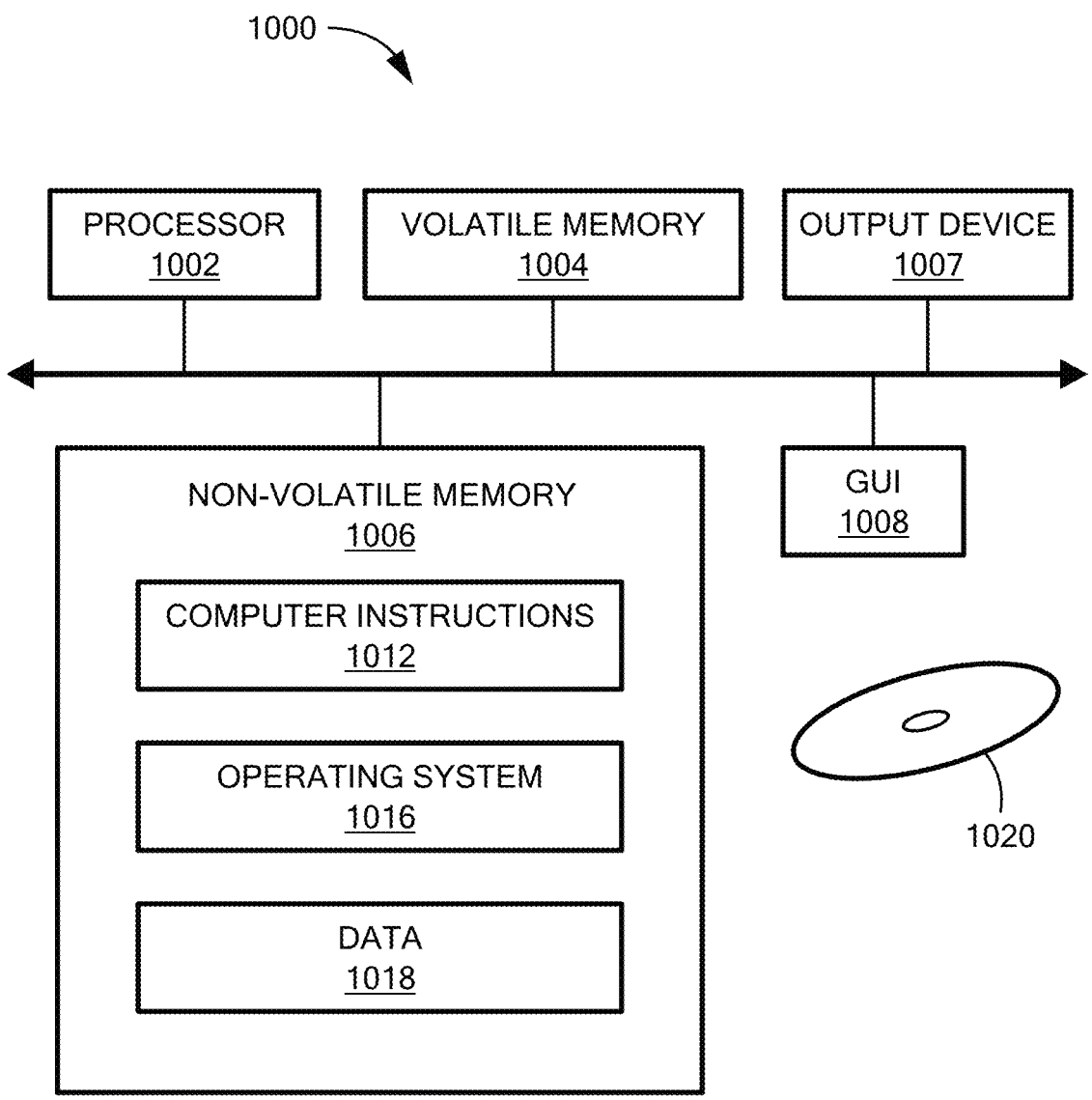
FIG. 10 is a schematic representation of an example computer that can perform at least a portion of the processing described herein.

FIG. 10 shows an exemplary computer 1000 that can perform at least part of the processing described herein. The computer 1000 includes a processor 1002, a volatile memory 1004, a non-volatile memory 1006 (e.g., hard disk), an output device 1007 and a graphical user interface (GUI) 1008 (e.g., a mouse, a keyboard, a display, for example). The non-volatile memory 1006 stores computer instructions 1012, an operating system 1016 and data 1018. In one example, the computer instructions 1012 are executed by the processor 1002 out of volatile memory 1004. In one embodiment, an article 1020 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A sensor, comprising:
   magnetic field sensing elements coupled in a differential bridge; and
   a processing module configured to receive signals from the bridge to determine a distance from the magnetic field sensing elements to a magnet from flux line divergence of magnetic flux generated by the magnet,
   wherein an output signal corresponding to the determined distance from the magnetic field sensing elements to the magnet is substantially linear for a given airgap range.

2. The sensor according to claim 1, wherein the magnetic field sensing elements comprise MR elements.

3. The sensor according to claim 1, wherein the magnetic field sensing elements comprise GMR elements.

4. The sensor according to claim 1, wherein the magnetic field sensing elements comprise Hall elements.

5. The sensor according to claim 1, further including a die, wherein the magnetic field sensing elements are positioned in relation to the die.

6. The sensor according to claim 5, wherein the magnetic field sensing elements are located in a plane.

7. The sensor according to claim 5, wherein the bridge element comprise elements L1, L2, R1, R2, and an output signal comprises combining signals from L1, L2, R1, R2.

8. The sensor according to claim 1, wherein the magnetic field sensing elements comprise MR elements coupled in a bridge, wherein each of the MR elements are substantially symmetric with respect to each other.

9. The sensor according to claim 1, wherein the magnetic field sensing elements comprise first, second, third, and fourth MR elements coupled in a bridge, wherein the first and second MR elements are located in proximity to each other.

10. The sensor according to claim 9, wherein the third and fourth MR elements are located in proximity to each other.

11. The sensor according to claim 1, wherein the magnetic field sensing elements comprise MR elements couple in a bridge having first and second pairs of MR elements, wherein the first and second pairs of the MR elements are spaced apart less than a width of the magnet.

12. The sensor according to claim 11, wherein the processing module subtracts signals from the first pair of MR elements from signals from the second pair of MR elements.

13. The sensor according to claim 1, wherein the processing module includes a transfer function for airgap versus output signal, wherein the transfer function includes a shape of the magnet.

14. The sensor according to claim 13, the shape of magnet includes a curved surface.

15. The sensor according to claim 14, wherein the curved surface comprises a convex shape.

16. A method, comprising:
   employing magnetic field sensing elements coupled in a differential bridge; and
   employing a processing module configured to receive signals from the bridge to determine a distance from the magnetic field sensing elements to a magnet from flux line divergence of magnetic flux generated by the magnet,
   wherein an output signal corresponding to the determined distance from the magnetic field sensing elements to the magnet is substantially linear for a given airgap range.

17. The method according to claim 16, wherein the magnetic field sensing elements comprise MR elements coupled in a bridge, wherein each of the MR elements are substantially symmetric with respect to each other.

18. The method according to claim 16, wherein the magnetic field sensing elements comprise MR elements.

19. The method according to claim 16, wherein the magnetic field sensing elements comprise GMR elements.

20. The method according to claim 16, wherein the magnetic field sensing elements comprise Hall elements.

21. The method according to claim 16, further including a die, wherein the magnetic field sensing elements are positioned in relation to the die.

22. The method according to claim 21, wherein the magnetic field sensing elements are located in a plane.

23. The method according to claim 22, wherein the bridge element comprise elements L1, L2, R1, R2, and an output signal comprises combining signals from L1, L2, R1, R2.

24. The method according to claim 16, wherein the processing module includes a transfer function for airgap versus output signal, wherein the transfer function includes a shape of the magnet, and further including selecting the curve of the magnet to achieve desired flux line divergence characteristics.

25. The method according to claim 16, wherein the magnetic field sensing elements comprise first, second, third, and fourth MR elements coupled in a bridge, wherein the first and second MR elements are located in proximity to each other.

26. The method according to claim 25, wherein the third and fourth MR elements are located in proximity to each other.

27. The method according to claim 16, wherein the magnetic field sensing elements comprise MR elements coupled in a bridge having first and second pairs of MR elements, wherein the first and second pairs of the MR elements are spaced apart less than a width of the magnet.

28. The method according to claim 27, wherein the processing module subtracts signals from the first pair of MR elements from signals from the second pair of MR elements.

29. The method according to claim 16, wherein the processing module includes a transfer function for airgap versus output signal, wherein the transfer function includes a shape of the magnet.

30. The method according to claim 29, the shape of magnet includes a curved surface.

31. The method according to claim 30, wherein the curved surface comprises a convex shape.

32. A magnet sensor IC package, comprising:
  means for magnetic field sensing having elements coupled in a differential bridge; and
  a means for processing for receiving signals from the bridge and determining a distance from the magnetic field sensing elements to a magnet from flux line divergence of magnetic flux generated by the magnet, wherein an output signal corresponding to the determined distance from the means for magnetic field sensing to the magnet is substantially linear for a given airgap range.

33. The magnet sensor IC package according to claim 32, wherein the bridge elements comprise elements L1, L2, R1, R2, and an output signal comprises combining signals from L1, L2, R1, R2.

34. The magnet sensor IC package according to claim 32, wherein the means for processing module includes a transfer function for airgap versus output signal, wherein the transfer function includes a shape of the magnet.

35. The magnet sensor IC package according to claim 32, further including a die, wherein the magnetic field sensing elements are positioned in relation to the die.

* * * * *